United States Patent
Liao

(10) Patent No.: US 8,115,104 B2
(45) Date of Patent: Feb. 14, 2012

(54) CIRCUIT BOARD WITH BURIED CONDUCTIVE TRACE FORMED THEREON AND METHOD FOR MANUFACTURING THE SAME

(75) Inventor: Guo Cheng Liao, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 335 days.

(21) Appl. No.: 12/473,806

(22) Filed: May 28, 2009

(65) Prior Publication Data
US 2009/0308647 A1    Dec. 17, 2009

(30) Foreign Application Priority Data
Jun. 11, 2008   (TW) ................. 97121703 A

(51) Int. Cl.
*H05K 1/03*     (2006.01)

(52) U.S. Cl. ........................................ 174/255
(58) Field of Classification Search ........... 174/255, 174/260–262; 361/760, 792–795
See application file for complete search history.

(56) References Cited

U.S. PATENT DOCUMENTS
2007/0235870 A1*   10/2007   Liao ........................... 257/734

FOREIGN PATENT DOCUMENTS
TW    200727760    7/2007
TW    200744419    12/2007

* cited by examiner

*Primary Examiner* — Javaid Nasri
(74) *Attorney, Agent, or Firm* — Lowe, Hauptman, Ham & Berner, LLP

(57) ABSTRACT

A circuit board with a buried conductive trace formed thereon according to the present invention is provided. A buried conductive trace layer is formed on the surface of a substrate and the pads and fingers of the conductive trace layer are heightened to facilitate the subsequent process of molding.

18 Claims, 8 Drawing Sheets

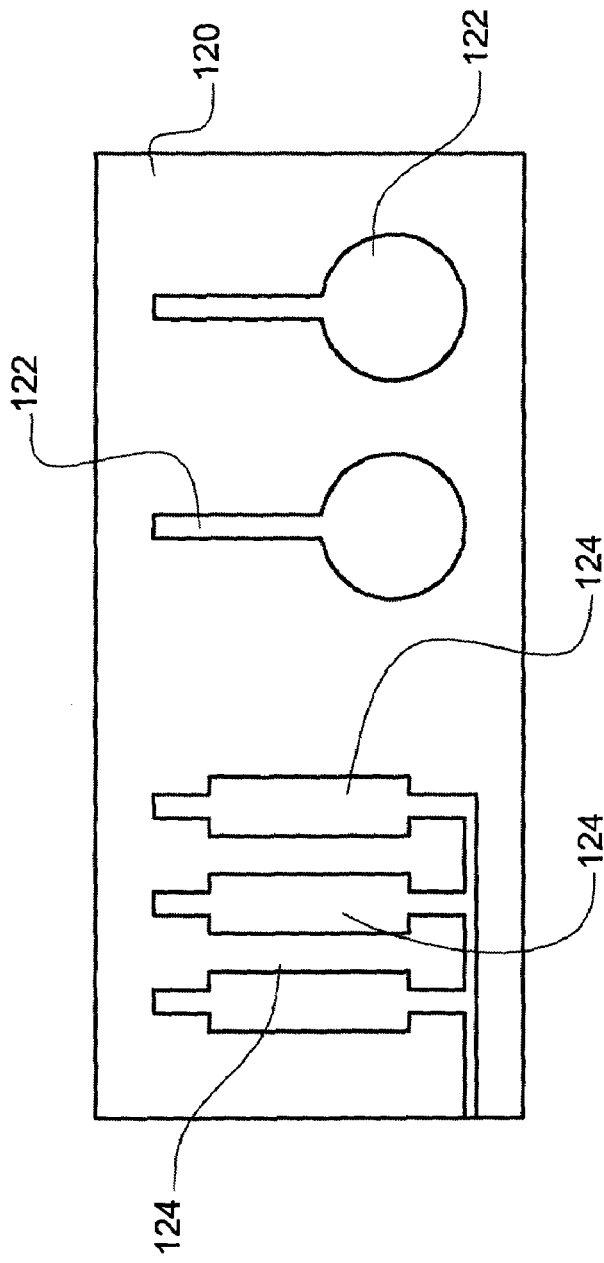
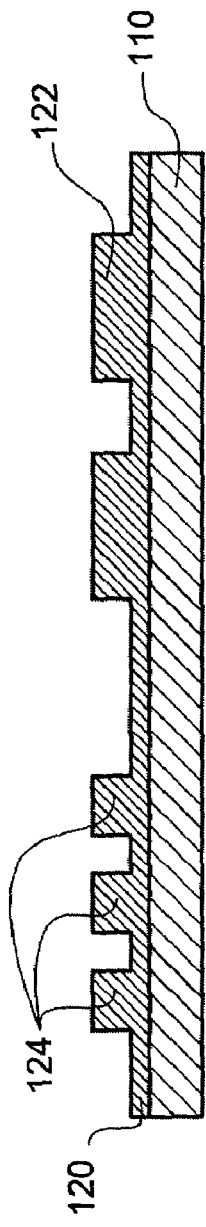
FIG. 1a (PRIOR ART)
FIG. 1b (PRIOR ART)

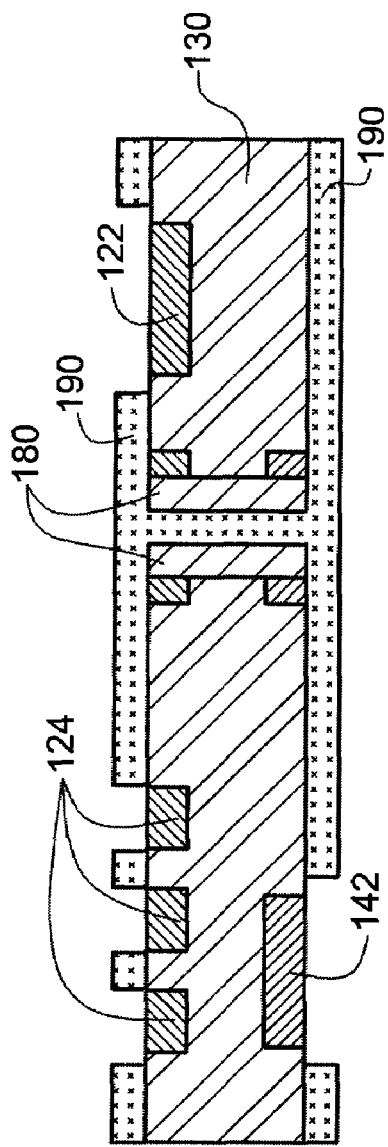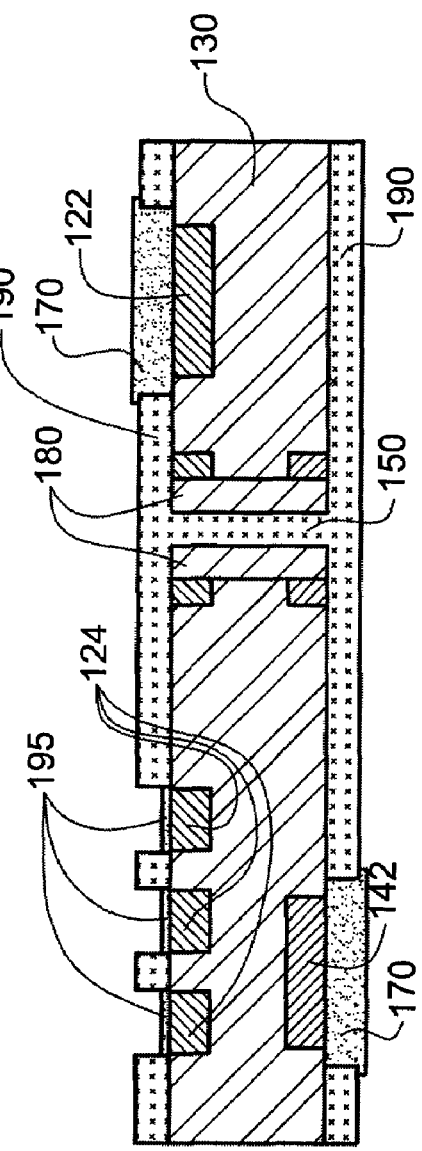
FIG. 1g (PRIOR ART)
FIG. 1h (PRIOR ART)

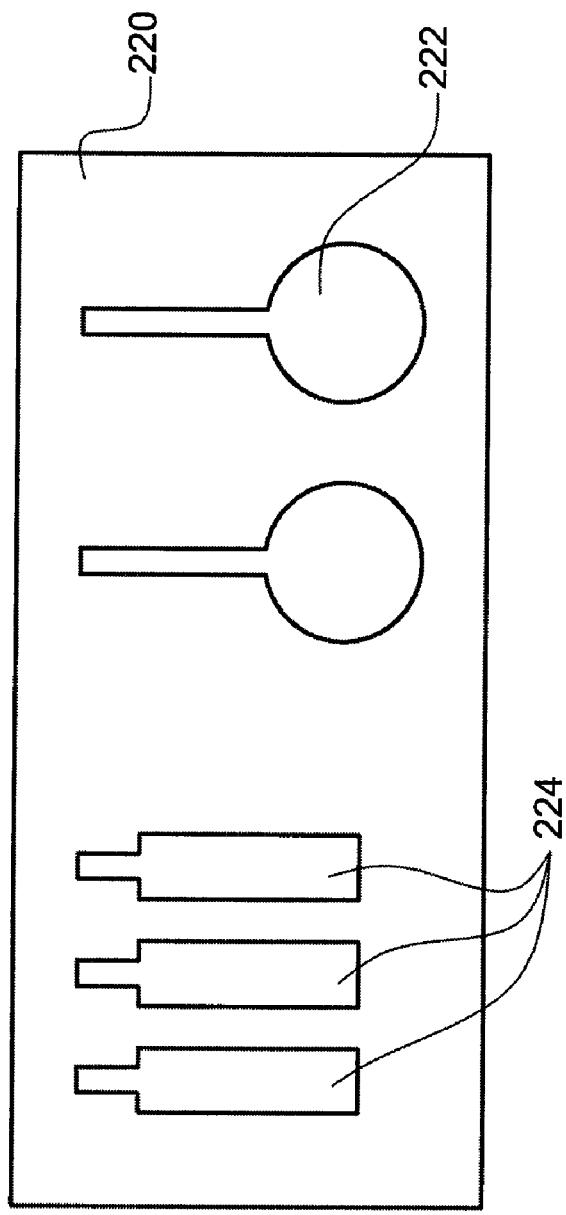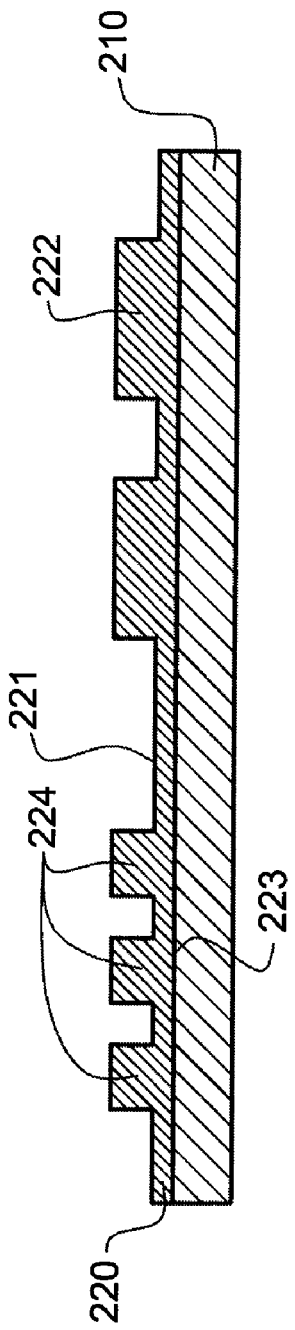

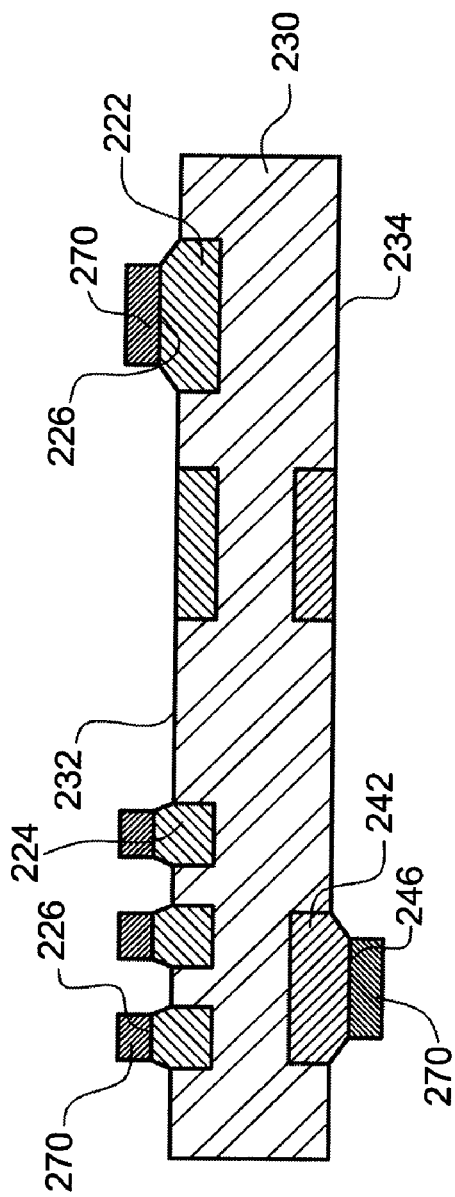
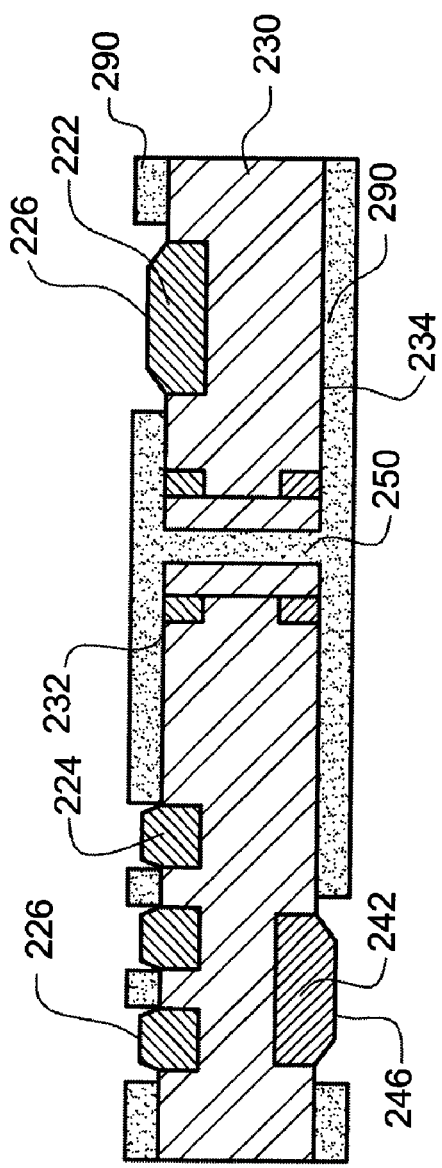
FIG. 3a
FIG. 3b

CIRCUIT BOARD WITH BURIED CONDUCTIVE TRACE FORMED THEREON AND METHOD FOR MANUFACTURING THE SAME

CROSS REFERENCE TO RELATED APPLICATION

This application claims the priority benefit of Taiwan Patent Application Serial Number 097121703 filed Jun. 11, 2008, the full disclosure of which is incorporated herein by reference.

BACKGROUND OF THE INVENTION

1. Field of the Invention

The invention relates to a circuit board and the method for manufacturing the same and more particularly, to a circuit board with a buried conductive trace formed thereon and the method for manufacturing the same.

2. Description of the Related Art

Recently, as electronic devices have become multifunctional, technology for package substrates has been rapidly developed so as to realize lightweight, thin short, small, and highly integrated fine circuit patterns. In particular, such lightweight, thin, short, small, and highly integrated fine circuit patterns are required for the Chip Scale Package (CSP) product group. In order to form fine circuit patterns on a small substrate, a press method is typically used to form a buried conductive trace on the substrate.

Referring to FIGS. 1a to 1h, a conventional method for forming a buried conductive trace on a substrate is first to form a copper layer 120 on a carrier 110. The copper layer 120 has protrusion structures 122, 124 and the pattern of the protrusion structures 122, 124 is corresponding to that of the conductive trace desired to be formed on a substrate (see FIGS. 1a and 1b). Afterward, the carrier 110 is pressed to a soft substrate 130, such as a B-stage Bismaleimide Triazine (BT) substrate such that the protrusion structures 122, 124 of the copper layer 120 are buried on a surface 132 of the substrate 130. A surface 134 opposite to the surface 132 of the substrate 130 can be optionally pressed with another copper layer 140 having protrusion structures 142 so as to form a conductive trace on the surface 134 (see FIG. 1c). The carriers 110 are separated from the copper layers 120, 140 and the copper layers 120, 140 are then thinned by etching so that the surfaces 132, 134 of the substrate 130 are exposed and the structures 122, 124, 142 still remain on and are flush with the surfaces 132, 134 of the substrate 130, respectively. The buried structures 122, 124, 142 will finally form the conductive trace layers on the substrate 130 (see FIG. 1d).

Subsequently, through holes 150 are formed on the substrate 130 by etching or drilling and a copper layer 160 is formed on the surfaces 132, 134 of the substrate 130 and on the inner walls of the through holes 150 by electroless plating (see FIG. 1e). A layer of dry film 170 is then formed on the surfaces 132, 134 of the substrate 130 to act as a plating mask in such a manner that the conductive trace layers on the substrate 130, i.e. the buried structures 122, 124, 142 are covered with the dry film 170 and the through holes 150 are exposed from the dry film 170. Next, the inner walls of the through holes 150 are plated with a copper layer 180 (see FIG. 1f). Afterward, the dry film 170 and the copper layer 160 formed on the surfaces 132, 134 of the substrate 130 by electroless plating are removed. Subsequently, a solder mask 190 is formed on the surfaces 132, 134 of the substrate 130 and exposes the structures 122, 124 and 142. The exposed portions of the structures 122, 124 and 142 are applied with a layer of organic solderability preservative (OSP) (see FIG. 1g). Next, the dry film 170 is formed on the structures 122 and 142 again and the structure 124 is plated with a nickel/gold layer 195 (see FIG. 1h). Finally, the dry film 170 is removed from the substrate 130.

The above structures 124 plated with the Ni/Au layer 195 are to be used as fingers to electrically connect to external circuitry through bonding wires. The structures 122 and 142 are to be used as pads to electrically connect to external circuitry through solder balls. Since the finger structures 124 are required to be plated with the Ni/Au layer 195, all the structures 124 are electrically connected together to facilitate the implementation of plating. However, the electrical performance of the structures 124 cannot be tested after being plated since they are electrically connected together.

Moreover, the resulting pad structures 122 are flush with the surface 132 of the substrate 130 and the solder mask 190 usually has a non-negligible thickness. Therefore, when the pad structures 122 are electrically connected to a chip by solder balls, the solder balls will have only a small portion of the thickness protruding from the solder mask 190 (not shown in the figure). As a result, this will lead to a small die gap between the chip and substrate 130. When an underfill material or molding compound is used to protect the chip in a subsequent package process, it is not easy to fill up the die gap with them. Thus, voids will be formed in the underfill material or molding compound in the die gap.

Accordingly, there exists a need to provide a method for manufacturing a circuit board with a buried conductive trace formed thereon to solve the above-mentioned problems.

SUMMARY OF THE INVENTION

It is an object of the present invention to provide a method for manufacturing a circuit board with a buried conductive trace formed thereon, wherein the pads are heightened.

In order to achieve the above object, the method for manufacturing a circuit board with a buried conductive trace formed thereon according to the first embodiment of the present invention is first to form a copper layer on a carrier. The second surface of the copper layer is attached to the carrier. The first surface opposite to the second surface of the copper has a plurality of protrusion structures protruding therefrom and the pattern of the protrusion structures is corresponding to that of the conductive trace desired to be formed on a substrate. Afterward, the carrier is pressed to a B-stage BT substrate so that the protrusion structures of the copper layer are buried on a surface of the substrate. Another surface of the substrate can be optionally pressed with another copper layer having protrusion structures. The carrier is separated from the copper layer so that the second surface of the copper layer is exposed. A layer of dry film is then formed on the copper layer to act as a plating mask and has openings to expose the first and second areas on the second surface of the copper layer.

Afterward, the substrate is plated to form a nickel/gold layer on the exposed first and second areas. Subsequently, the dry film is removed and the copper layer is etched so that the surfaces of the substrate are exposed and the protrusion structures of the copper layer still remain on and are flush with the surfaces of the substrate. Since the nickel/gold layer acts as an etch mask and can protect the portion of the copper layer thereunder from being etched, a plurality of protrusion structures is therefore formed on the surfaces of the substrate.

Finally, plated through holes are formed on the substrate and a solder mask is formed on the surface of the substrate and exposes the nickel/gold layer.

The method for manufacturing a circuit board with a buried conductive trace formed thereon according to the second embodiment of the present invention is substantially the same as the method according to the first embodiment of the present invention. However, there are still some differences between them. According to the method of the second embodiment of the present invention, the first and second areas on the second surface of the copper layer are not required to be plated with the nickel/gold layer to act as an etch mask. Instead, a dry film is formed on only the first and second areas. The copper layer is then etched so that the surfaces of the substrate are exposed and the protrusion structures of the copper layer still remain on and are flush with the surfaces of the substrate. Since the dry film acts as an etch mask and can protect the portion of the copper layer thereunder from being etched, a plurality of protrusion structures is therefore formed on the surfaces of the substrate. Afterward, the dry film is removed and plated through holes are formed on the substrate. Subsequently, a solder mask is formed on the surfaces of the substrate and exposes the first and second areas. A layer of organic solderability preservative is then applied to the exposed first and second areas.

It is another object of the present invention to provide a circuit board manufactured by the above method.

According to the method of the present invention for manufacturing a circuit board with a buried conductive trace formed thereon, the structures buried on the surfaces of the substrate are to form the conductive traces on the substrate. The copper layer located on the first and second areas is to be used as pads and fingers, respectively, to electrically connect to external circuitry, such as a chip. Since the first areas to be used as pads protrude from the substrate, solder balls will protrude more from the solder mask when a chip is electrically connected to the first areas through the solder balls. This will increase the die gap between the chip and the substrate. Consequently, it is easier for the underfill material or molding compound to flow to and fill up the die gap in the package process. Thus, voids will not be formed in the underfill material or molding compound in the die gap. Moreover, since the second areas to be used as fingers are not required to be electrically connected together, the electrical performance thereof can be tested immediately after the circuit board is manufactured.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 1a to 1h illustrate a conventional method for manufacturing a circuit board with a buried conductive trace formed thereon.

FIGS. 2a to 2g illustrate the method for manufacturing a circuit board with a buried conductive trace formed thereon according to the first embodiment of the present invention.

FIGS. 3a to 3b illustrate the method for manufacturing a circuit board with a buried conductive trace formed thereon according to the second embodiment of the present invention.

DETAILED DESCRIPTION OF THE PREFERRED EMBODIMENT

Figure 1C:
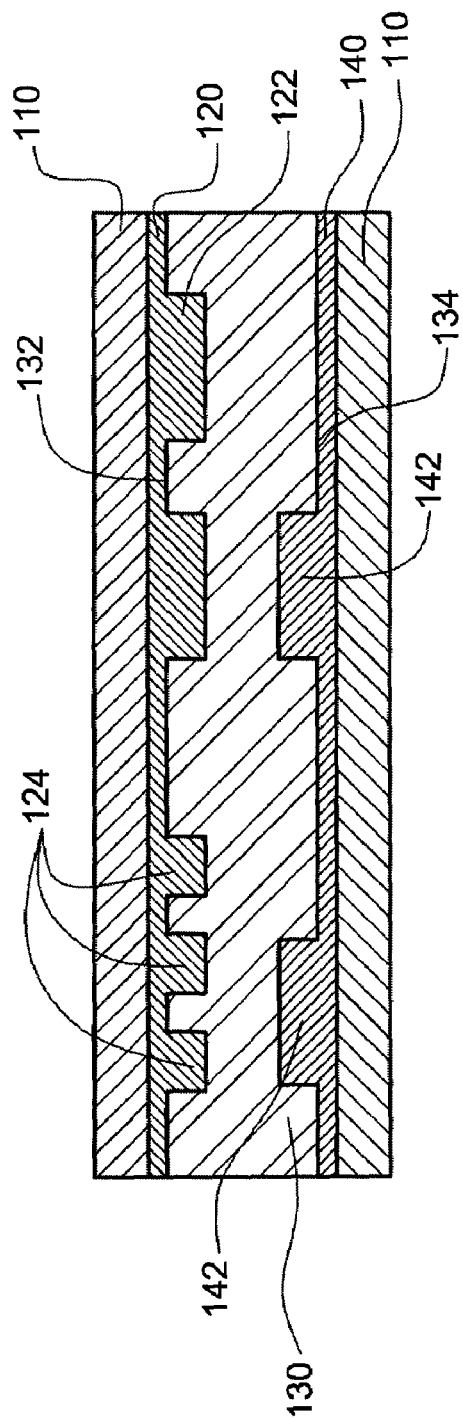
Figure 1D:
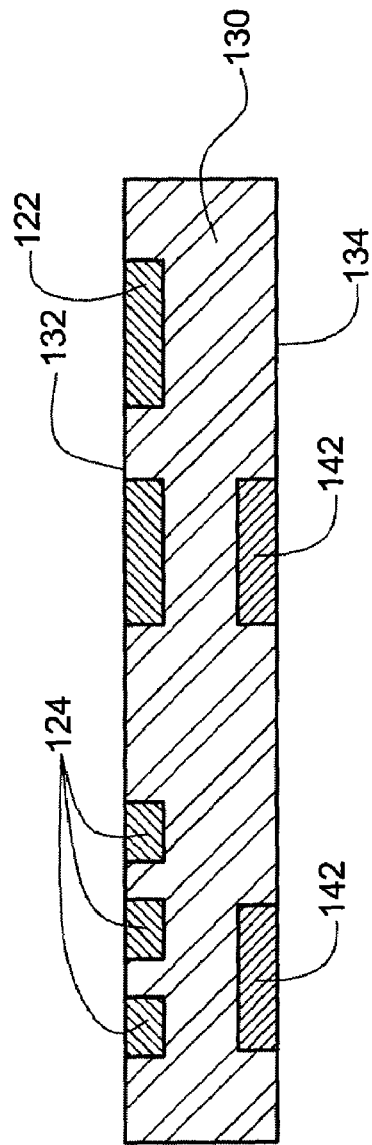
Figure 1E:
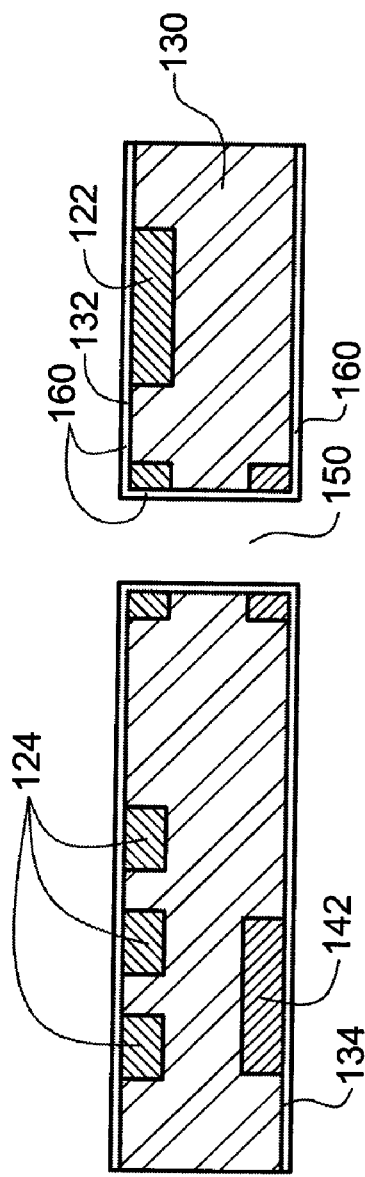
Figure 1F:
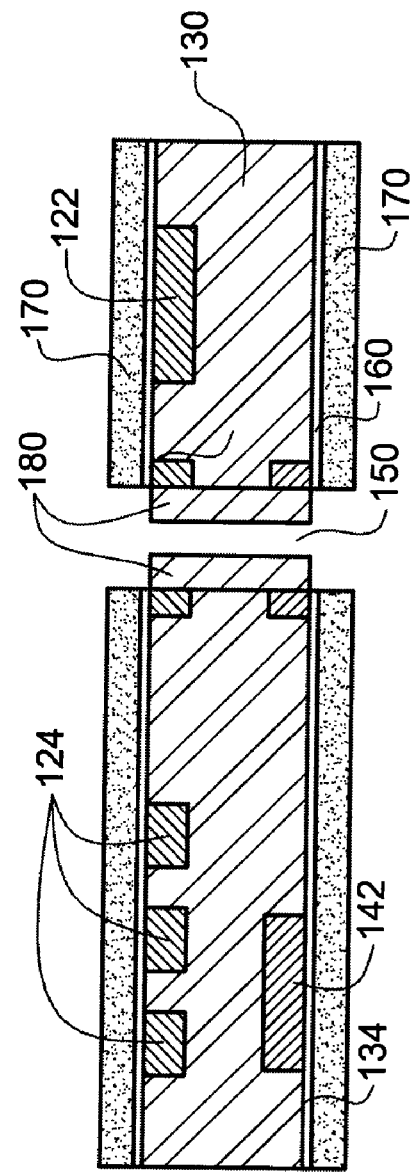

Referring to FIGS. 2a to 2g, the method for manufacturing a circuit board with a buried conductive trace formed thereon according to the first embodiment of the present invention is first to form a metal layer 220, such as a copper layer on a carrier 210. The copper layer 220 has a first surface 221 and a second surface 223 opposite to the first surface 221. The second surface 223 of the copper layer 220 is attached to the carrier 210. The first surface 221 of the copper layer 220 has a plurality of protrusion structures 222 and 224 protruding therefrom and the pattern of the protrusion structures 222, 224 is corresponding to that of the conductive trace desired to be formed on a substrate (see FIGS. 2a and 2b). Afterward, the carrier 210 is pressed to a soft substrate 230, such as a B-stage Bismaleimide Triazine substrate so that the protrusion structures 222, 224 of the copper layer 220 are buried on a surface 232 of the substrate 230. A surface 234 opposite to the surface 232 of the substrate 230 can be optionally pressed with another metal layer 240, such as a copper layer having protrusion structures 242 so as to form a conductive trace on the surface 234 (see FIG. 2c). The carriers 210 are separated from the copper layers 220, 240 so that the copper layer 240 and the second surface 223 of the copper layer 220 are exposed. A layer of dry film 270 is then formed on the copper layer 240 and the second surface 223 of the copper layer 220 to act as a plating mask and has openings 272 to expose the areas 226 on the second surface 223 of the copper layer 220 and the areas 246 on the copper layer 240 (see FIG. 2d).

Figure 2C:
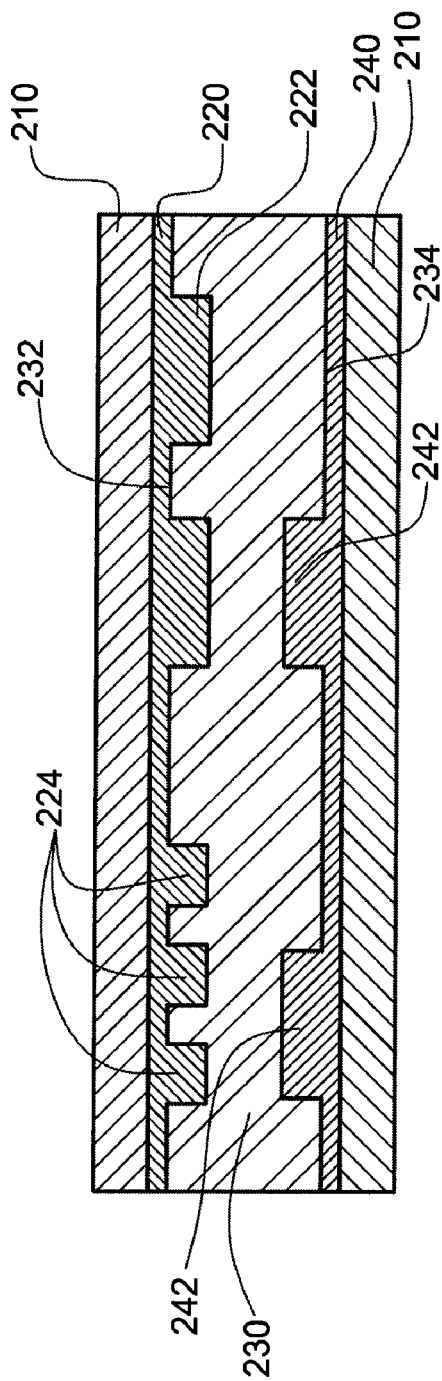
Figure 2D:
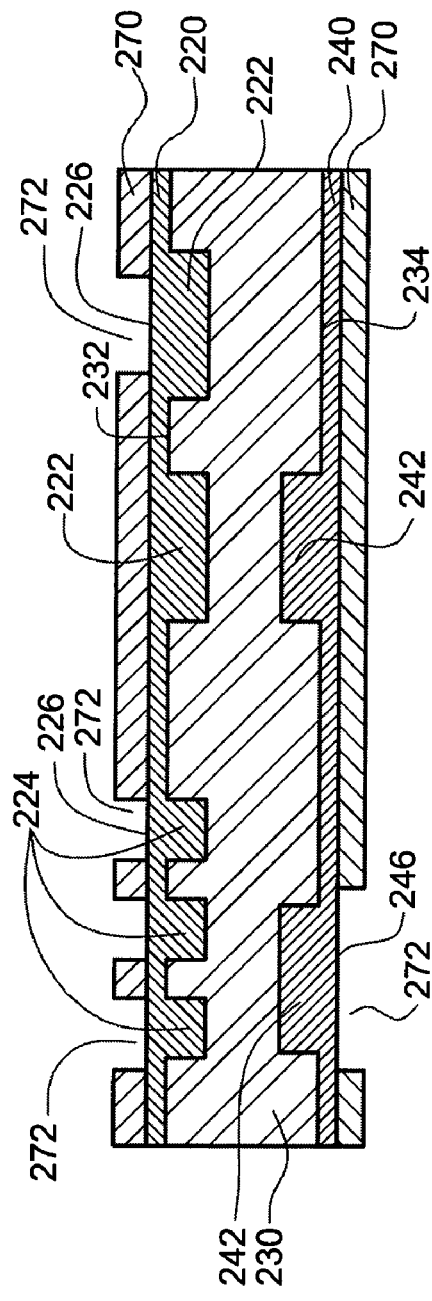
Figure 2E:
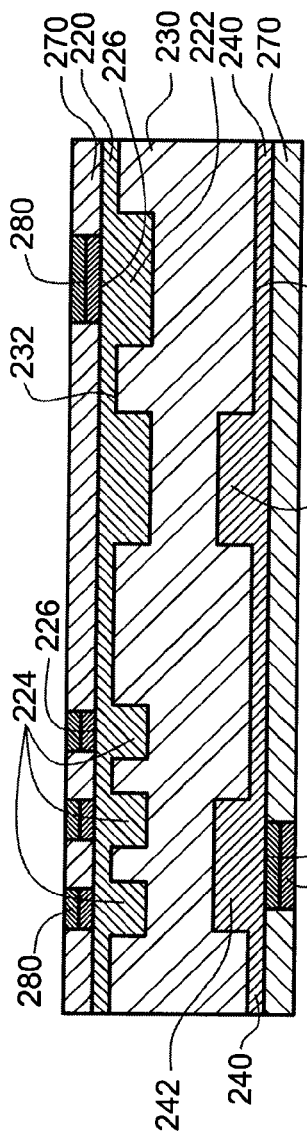
Figure 2F:
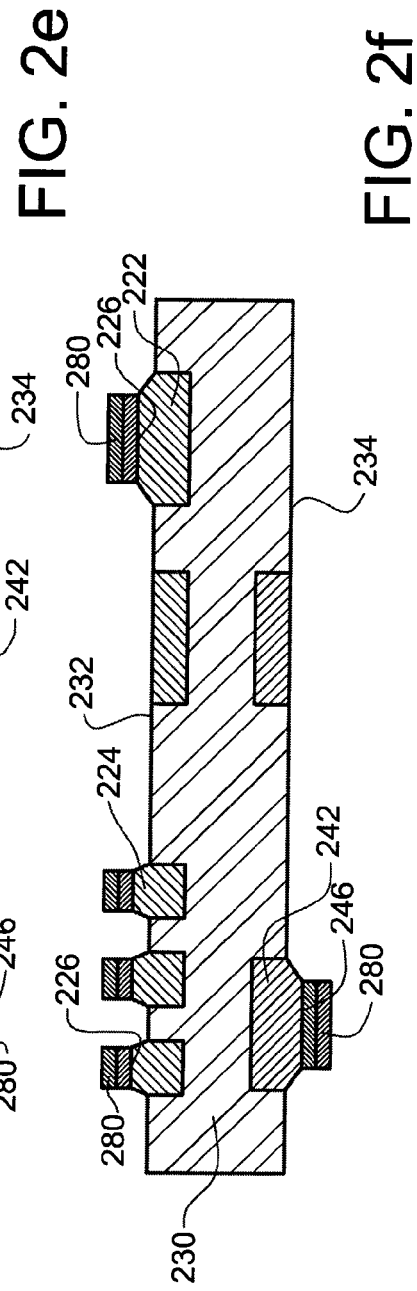
Figure 2G:
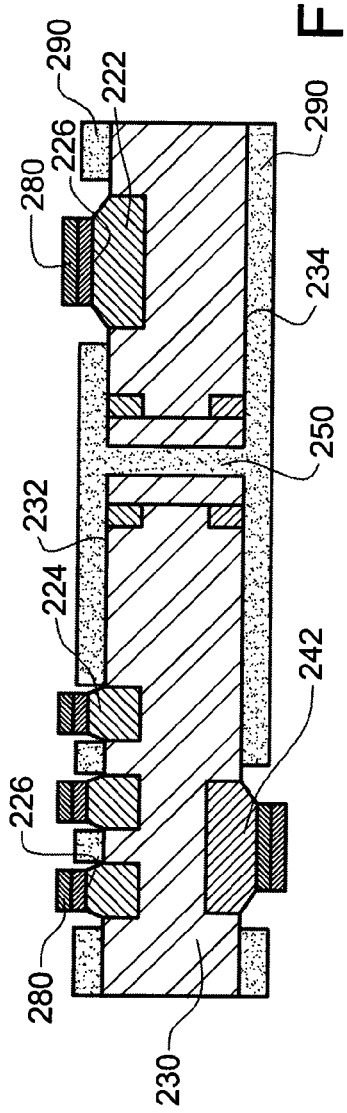

Afterward, the substrate 230 is plated to form a metal layer 280, such as a nickel/gold (Ni/Au) layer on the exposed areas 226 and 246 (see FIG. 2e). Subsequently, the dry film 270 is removed and the copper layers 220, 240 are etched so that the surfaces 232, 234 of the substrate 230 are exposed and the structures 222, 224, 242 still remain on and are flush with the surfaces 232, 234 of the substrate 230, respectively. Since the Ni/Au layer 280 acts as an etch mask and can protect the portions of the copper layers 220 and 240 thereunder from being etched, a plurality of protrusion structures is therefore formed on the surfaces 232, 234 of the substrate 230 (see FIG. 2f). Finally, plated through holes 250 are formed on the substrate 230 by etching or drilling and a solder mask 290 is formed on the surfaces 232, 234 of the substrate 230 and exposes the Ni/Au layer 280 (see FIG. 2g).

Referring to FIGS. 3a to 3b, the method for manufacturing a circuit board with a buried conductive trace formed thereon according to the second embodiment of the present invention is substantially the same as the method according to the first embodiment of the present invention. However, there are still some differences between them. According to the method of the second embodiment of the present invention, the areas 226 on the second surface 223 of the copper layer 220 and the areas 246 on the copper layer 240 are not required to be plated with the Ni/Au layer 280 to act as an etch mask. Instead, a dry film 270 is formed on only the areas 226 and 246. The copper layers 220 and 240 are then etched so that the surfaces 232, 234 of the substrate 230 are exposed and the structures 222, 224, 242 still remain on and are flush with the surfaces 232, 234 of the substrate 230, respectively. Since the dry film 270 acts as an etch mask and can protect the portions of the copper layers 220 and 240 thereunder from being etched, a plurality of protrusion structures is therefore formed on the surfaces 232, 234 of the substrate 230 (see FIG. 3a). Afterward, the dry film 270 is removed and plated through holes 250 are formed on the substrate 230. Subsequently, a solder mask 290 is formed on the surfaces 232, 234 of the substrate 230 and exposes the areas 226, 246 (see FIG. 3b). A layer of organic solderability preservative is then applied to the exposed areas 226, 246 (not shown in the figure).

Referring back to FIG. 2g, the circuit board of the present invention includes the substrate 230, which has two opposing surfaces 232, 234 and the through holes 250 plated with a copper layer. The conductive trace layer 222 is buried on the substrate 230 and exposed from the surface 232. The conductive trace layer 242 is buried on the substrate 230 and exposed from the surface 234. The conductive trace layer 222 has the areas 226 protruding from the surface 232 of the substrate 230 and the conductive trace layer 242 has the areas 246 protruding from the surface 234 of the substrate 230. The Ni/Au layer 280 is formed on the areas 226 to be used as pads or fingers to electrically connect to external circuitry through solder balls or bonding wires. In addition, the Ni/Au layer 280 is also formed on the areas 246 to be used to electrically connect to another circuit board.

According to the method of the present invention for manufacturing a circuit board with a buried conductive trace formed thereon, the structures 222, 224, 242 buried on the surfaces 232, 234 of the substrate 230 are to form the conductive traces on the substrate 230. The copper layer 220 located on the areas 226 and the copper layer 240 located on the areas 246 are adapted to electrically connect to external circuitry, wherein the areas 226 on the structures 222 are to be used as pads to electrically connect to such as a chip through solder balls, the areas 226 on the structures 224 are to be used as fingers to electrically connect to such as a chip through bonding wires and the areas 246 on the structures 242 are to be used as pads to electrically connect to such as another circuit board through solder balls (not shown in the figure). Since the areas 226 as pads protrude from the substrate 230, solder balls will protrude more from the solder mask 290 as compared with the above conventional circuit board when a chip is electrically connected to the areas 226 through the solder balls (not shown in the figure). This will increase the die gap between the chip and the substrate 230. Consequently, it is easier for the underfill material or molding compound to flow to and fill up the die gap in the package process. Thus, voids will not be formed in the underfill material or molding compound in the die gap. Moreover, since the areas 226 on the structures 224 to be used as fingers are not required to be electrically connected together, the electrical performance thereof can be tested immediately after the circuit board is manufactured.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a circuit board, comprising the steps of:
    providing a substrate with a first surface and a second surface opposite to the first surface;
    forming a first metal layer on the first surface of the substrate, the first metal layer has a first surface and a second surface opposite to the first surface, the first surface of the first metal layer having a plurality of protrusion structures buried on the first surface of the substrate, wherein the second surface of the first metal layer has a first area defined thereon;
    forming an etch mask on the first area;
    etching the first metal layer so that the portions of the first metal layer protruding from the first surface of the substrate and exposed from the etch mask are removed;
    removing the etch mask from the substrate; and
    forming a solder mask on the first surface of the substrate and exposing the first area of the first metal layer.

2. The method as claimed in claim 1, wherein the step of forming a first metal layer on the first surface of the substrate comprises:
    providing a carrier;
    forming the first metal layer on the carrier, wherein the second surface of the first metal layer is attached to the carrier;
    pressing the carrier to the substrate so that the protrusion structures of the first metal layer are buried on the first surface of the substrate; and
    removing the carrier.

3. The method as claimed in claim 1, wherein the first metal layer is a copper layer.

4. The method as claimed in claim 1, wherein the etch mask is a dry film.

5. A method for manufacturing a circuit board, comprising the steps of:
    providing a substrate with a first surface and a second surface opposite to the first surface;
    forming a first metal layer on the first surface of the substrate, the first metal layer has a first surface and a second surface opposite to the first surface, the first surface of the first metal layer having a plurality of protrusion structures buried on the first surface of the substrate, wherein the second surface of the first metal layer has a first area and a second area defined thereon;
    forming a plating mask on the second surface of the first metal layer and exposing the first and second areas;
    forming a second metal layer on the first and second areas;
    removing the plating mask;
    etching the first metal layer so that the portions of the first metal layer protruding from the first surface of the substrate and exposed from the second metal layer are removed; and
    forming a solder mask on the first surface of the substrate and exposing the second metal layer.

6. The method as claimed in claim 5, wherein the step of forming a first metal layer on the first surface of the substrate comprises:
    providing a carrier;
    forming the first metal layer on the carrier, wherein the second surface of the first metal layer is attached to the carrier;
    pressing the carrier to the substrate so that the protrusion structures of the first metal layer are buried on the first surface of the substrate; and
    removing the carrier.

7. The method as claimed in claim 5, wherein the second metal layer is a nickel/gold layer.

8. The method as claimed in claim 5, wherein the second metal layer on the first area is adapted to be a pad for being electrically connected to external circuitry through a solder ball.

9. The method as claimed in claim 5, wherein the second metal layer on the second area is adapted to be a finger for being electrically connected to external circuitry through a bonding wire.

10. The method as claimed in claim 5, further comprising:
    forming a third metal layer on the second surface of the substrate, the third metal layer has a first surface and a second surface opposite to the first surface, the first surface of the third metal layer having a plurality of protrusion structures buried on the second surface of the substrate, wherein the second surface of the third metal layer has a first area defined thereon;

forming the plating mask on the second surface of the third metal layer and exposing the first area of the third metal layer;

forming a fourth metal layer on the first area of the third metal layer;

removing the plating mask from the second surface of the third metal layer;

etching the third metal layer so that the portions of the third metal layer protruding from the second surface of the substrate and exposed from the fourth metal layer are removed; and forming the solder mask on the second surface of the substrate and exposing the fourth metal layer.

11. The method as claimed in claim 10, wherein the fourth metal layer on the first area of the third metal layer is adapted to be electrically connected to another circuit board.

12. A circuit board, comprising:
a substrate having a first surface and a second surface opposite to the first surface;
a first conductive trace layer buried on the substrate and exposed from the first surface of the substrate, wherein the first conductive trace layer has a first area and a second area, the first and second areas protrude from the first surface of the substrate; and
a solder mask formed on the first surface of the substrate and exposing the first and second areas.

13. The circuit board as claimed in claim 12, further comprising:
a first metal layer formed on the first and second areas of the first conductive trace layer.

14. The circuit board as claimed in claim 13, wherein the first metal layer is a nickel/gold layer.

15. The circuit board as claimed in claim 12, further comprising:
a second conductive trace layer buried on the substrate and exposed from the second surface of the substrate, wherein the second conductive trace layer has a third area, the third area protrudes from the second surface of the substrate, wherein the solder mask is further formed on the second surface of the substrate and exposing the third area.

16. The circuit board as claimed in claim 15, further comprising a second metal layer formed on the third area of the second conductive trace layer and adapted to be electrically connected to another circuit board.

17. The circuit board as claimed in claim 16, wherein the second metal layer is a nickel/gold layer.

18. The circuit board as claimed in claim 12, wherein the substrate further has a through hole plated with a copper layer.

* * * * *